Jan. 7, 1958 J. M. SPENCER 2,818,760

MODULATION SYSTEM FOR ELECTRICAL MUSICAL INSTRUMENT

Filed Sept. 28, 1953

INVENTOR.
JAMES M. SPENCER
BY R. W. Hodgson 2,818,760
Patented Jan. 7, 1958

2,818,760

MODULATION SYSTEM FOR ELECTRICAL MUSICAL INSTRUMENT

James M. Spencer, Glendale, Calif.

Application September 28, 1953, Serial No. 382,544
5 Claims. (Cl. 84—1.04)

Figure 1:
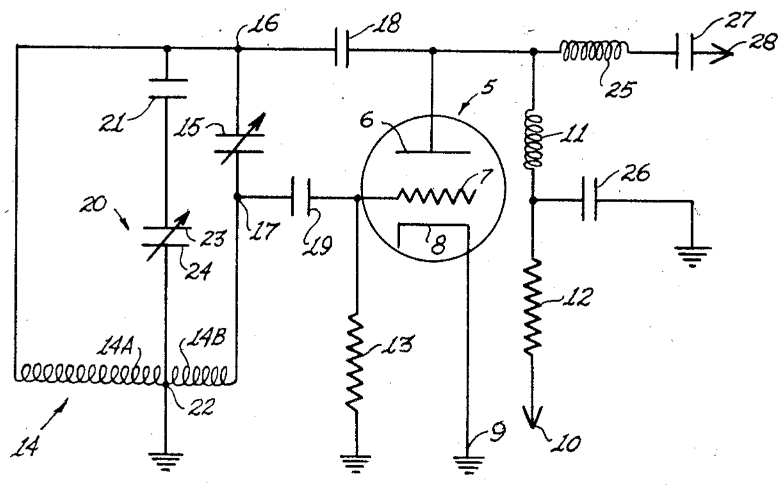

This invention relates to musical instruments, mechanico-electric and acoustic-electric translating systems, and more specifically to modulation systems wherein the vibrations of a vibrator or a plurality of vibrators are translated into electrical oscillation amplitude and/or frequency variations (usually both). An output current carrying said variations may thereafter be fed into suitable output detector means to effectively detect or separate the modulation frequency from the carrier frequency to provide an output signal of varying amplitude corresponding to the input modulation vibration. Said output signal may thereafter be employed for the activation of further apparatus in the usual manner for recording or reproducing the variations for immediate or subsequent aural reception. If desired, in certain cases, the output detector means may comprise portions of the input stage of the further sound reproducing and/or recording apparatus referred to, thus eliminating the necessity of a separate output detector. In this case, the input stage of said further apparatus acts as the detector effectively separating the modulation frequency from the carrier frequency. In the event that an even greater output signal is desired, the output detector means may include frequency discriminator means adapted to supplement the amplitude variations of the output signal with additional amplitude variations produced by converting frequency variations of the output signal into corresponding amplitude variations. However the system will operate entirely satisfactory without frequency discriminator means.

Vibrators, as contemplated in this invention, may include such typical vibrators as strings under longitudinal tension, reeds, diaphragms, and so forth.

Most prior art modulation systems employed in mechanico-electric translation systems have numerous disadvantages and limitations which the system of this invention overcomes.

For example, the ordinary frequency modulation type of acoustic-electric translating system is very critical in adjustment and difficult to operate because of the effect of oscillator frequency drift. Most systems require close control of the resonant frequency of the oscillator's components through accurate tuning or various associated automatic frequency control circuits since the final amplitude variations of the desired signal depend upon a consistent mean frequency and upon consistent frequency response.

The ordinary electro-static, amplitude modulation type of acoustic-electric translating system has numerous disadvantages which are well known in the art. Since these disadvantages are so well known, they will not be enumerated here.

The present invention consists of an oscillator circuit having a modulating condenser operatively connected across a portion of the inductance of a tuned resonant circuit and between the anode and cathode of a multi-electrode oscillator tube, whereby mechanical variation of the capacity of the modulating condenser causes frequency modulation of the oscillation variations which causes amplitude modulation of the plate current of the oscillator tube, which modulation may be effectively detected by various output detector circuits and/or means.

In one preferred embodiment of the present invention, the tuned resonant circuit consists of an inductance and a variable capacitance in shunt with respect to each other and effectively connected at opposite ends of the tank to the plate and the grid, respectively, of a triode oscillator tube, the cathode is connected to a tap from the inductance, and the modulating condenser is effectively connected to the plate and the cathode so as to also be in shunt with respect to a portion of the resonant circuit's inductance. The modulating condenser's shunt relationship with respect to the tank circuit permits variation of the resonant frequency of said tank circuit by mechanical variation of the capacity of the modulating condenser. The modulating condenser may be of a type described in my copending patent application, Electrode Attachment for Musical Instruments, Serial No. 382,545, filed September 28, 1953, now abandoned, which discloses a condenser having a plurality of vibratable elements, such as piano strings, in capacitive relationship with respect to an opposing plate common to all of the vibratable elements (or to several such plates), the striking of the strings causing vibration thereof within the audio frequency range.

The audio frequency component present in the oscillator tube's plate current is developed over and detected by an output detector means, which, in one form, may comprise filter means which filters out the radio frequency component, leaving the audio component. Since a discriminator circuit is not necessary as an intermediate step for the detection of the audio intelligence being translated, oscillator frequency drift has no appreciable effect.

From the above breif description, it will be obvious that the prior art disadvantages are completely or virtually completely overcome in and through the use of my invention.

With the above points in mind, it is an object of this invention to provide a modulation system effectively adapted for use with a musical instrument having a vibrator or plurality of vibrators whereby the mechanical vibrations thereof may be translated into electrical oscillation variations.

Another object of this invention is the provision of a modulation system wherein the response is substantially independent of oscillator frequency drift.

Additional and related objects will be clear to those skilled in the art upon a careful study of this specification, the accompanying drawings, and the appended claims.

Figure 2:
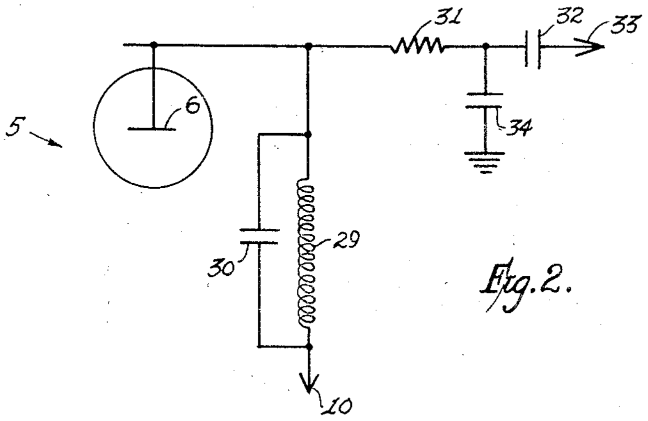

In order to facilitate understanding of my invention, reference will be made to the following drawings, in which:

Fig. 1 is a partial schematic drawing of one preferred embodiment of the invention; and Fig. 2 is a partial schematic drawing of a modified form of the detector means illustrated in Fig. 1.

Referring to Fig. 1, in which various electrical components well known in the art, such as filament and power supply, for example, are omitted for the sake of clarity, it can be seen that the oscillator tube, indicated generally at 5, is a triode having a plate or anode 6, a control grid 7 and a cathode 8, the cathode being grounded at 9. Positive direct current anode voltage is supplied through the lead 10, which is connected to a B— power supply and/or decoupling network (not shown) through a radio frequency choke coil 11 and a load resistor 12. The control grid 7 is connected to ground through a grid leak resistor 13. The tuned resonant circuit consists of a coil inductance, indicated generally at 14, connected in parallel to a variable capacitor 15 at the effective end points 16 and 17, the end point 16 being effectively connected to the anode 6 through a direct current blocking capacitor 18 and the end point 17 being effectively connected to the control grid 7 through a coupling capacitor 19. The capacitor 15 may have a fixed capacity but is here shown as variable in order to permit selection of an oscillation frequency, such as 4500 kilocycles per second, which will be neither the fundamental nor multiple of a standard broadcast frequency, as, in using this invention for the mechanico-electric translation of the vibrations of the strings of a pianoforte, the device may operate as a detector and may transmit undesired signals to the following stages, if operated at an undesirable frequency. The modulating condenser 20 is connected through an isolating condenser 21 to the end point 16 of the tank circuit and to the tap 22 on the coil 14, said tap 22 being grounded so as to be effectively connected to the cathode 8 of the oscillator tube 5. Thus, the modulating condenser 20 is in parallel with the left portion 14A of the inductance 14, and the right portion 14B of the inductance 14 is effectively connected between the control grid 7 and the cathode 8 of the oscillator tube 5. The modulating condenser 20 may be variable in any mechanical or other manner, and may have a plurality of plates in opposition to a plurality of paired plates or in opposition to a single common plate, or may have merely two plates in continuously variable capacitive relationship with respect to each other. If the modulating condenser 20 is of the type disclosed in my co-pending patent application, Electrode Attachment for Musical Instruments, Serial No. 382,545, filed September 28, 1953, now abandoned, the plate 23 may be a single plate common to a plurality of vibratable elements, such as strings or reeds, represented by the single plate 24.

In operation, the tuned resonant circuit will cause oscillations at a frequency determined by the normal values of the component capacitors 15, 20 and 21 and the inductance 14. Upon mechanical audio variation of the capacity of the modulating condenser 20, the resonant frequency of the tank circuit will vary at the rate of said audio variation, causing amplitude modulation of the plate current of the oscillator tube 5 due to the frequency response characteristics of the circuitry. The radio frequency is detected or filtered by the output detector means or filter circuit, including the radio frequency choke coils 11 and 25 and the radio frequency by-pass capacitor 26 which is grounded. The audio signal is fed through the coupling capacitor 27 to any desired additional stages (not shown) through the lead 28.

In order to illustrate the adaptability of this invention to various types of output detector and/or filter circuits, another type is shown in Fig. 2. The components not illustrated may be the same as shown in Fig. 1. The output signal is developed over the output tank circuit consisting of the inductance 29 and the capacitor 30, the inductance 29 connecting the plate 6 of the oscillator tube 5 to the B— power supply and/or decoupling network (not shown) at the lead 10. The resonant frequency of the output tank circuit is not at all critical, although the greatest output signal will be obtained when the resonant frequency is approximately the same as the normal resonant frequency of the oscillation frequency-determining tank circuit illustrated in Fig. 1. The audio frequency output signal is fed through the resistor 31 and the coupling capacitor 32 through the lead 33 to additional stages, whereas the radio frequency is filtered out through the by-pass capacitor 34 to ground.

Numerous modifications of my invention within the spirit thereof will be apparent to those skilled in the art, and all such modifications, properly within the scope of the present invention, are intended to be included and comprehended herein.

The exact compositions, configurations, relative positionings, and cooperative relationships between the various component parts of the present invention are not critical and can be modified substantially within the spirit hereof.

The embodiments of the present invention specifically described, illustrated and claimed herein are exemplary only, and are not intended to limit the scope of the present invention, which is to be interpreted in the light of the prior art and the appended claims only, with due consideration for the doctrine of equivalents.

I claim:

1. Electro-acoustic translating apparatus responsive to externally applied mechanical vibratory movement, as produced by vibratory elements of a musical instrument, said electro-acoustic translating apparatus being cooperable with power supply means, amplifying means and sound producing means for sound producing purposes, said electro-acoustic translating apparatus comprising: an electron oscillator tube including a cathode, anode, and control grid; output detector means; said anode being operatively connected to said output detector means; a tuned resonant circuit operatively connected at one end thereof to said anode and operatively connected at the other end thereof to said control grid in oscillator frequency-determining relationship with respect to said electron oscillator tube; and modulating condenser means having stationary plate means and mechanically vibratable element means in capacitive relation thereto, said vibratable element means being physically mechanically vibratable in response to mechanical input thereto, said modulating condenser means being effectively connected to said cathode and said anode of said electron oscillator tube and also being connected in parallel to and across a portion of said tuned resonant circuit less than the whole tuned resonant circuit connected between said anode and said control grid, thus being in frequency and amplitude modulation relationship with respect to said electron oscillator tube.

2. Electro-acoustic translating apparatus responsive to externally applied mechanical vibratory movement, as produced by vibratory elements of a musical instrument, said electro-acoustic translating apparatus being cooperable with power supply means, amplifying means and sound producing means for sound producing purposes, said electro-acoustic translating apparatus comprising: an electron oscillator tube including a cathode, anode, and control grid; a tuned resonant circuit including inductance and capacitance, said resonant circuit being operatively connected at one end thereof to said anode and at the other end thereof to said control grid, said inductance being operatively connected at an intermediate connection point near but spaced from the control grid end thereof to said cathode thus defining a first inductance portion effectively connected between said anode and said cathode and a second inductance portion effectively connected between said cathode and said control grid, said first and second inductance portions including said intermediate connection point therebetween; and modulating condenser means having stationary plate means and mechanically vibratable element means in capacitive relation thereto, said vibratable element means being physically mechanically vibratable in response to mechanical input thereto, said modulating condenser means being effectively connected to said cathode and said anode of said electron oscillator tube and also being connected in parallel to and across said first inductance portion only as far as said intermediate connection point.

3. Electro-acoustic translating apparatus responsive to externally applied mechanical vibratory movement, as produced by vibratory elements of a musical instrument, said electro-acoustic translating apparatus being cooperable with power supply means, amplifying means and sound producing means for sound producing purposes, said electro-acoustic translating apparatus comprising: an electron oscillator tube including a cathode, anode and control grid; an output audio detector means comprising a radio-frequency output filter circuit operatively connected to said anode; a tuned resonant circuit including inductance and capacitance, said resonant circuit being operatively connected at one end thereof to said anode and at the other end thereof to said control grid, said inductance being operatively connected at an intermediate connection point near but spaced from the control grid end thereof to said cathode thus defining a first inductance portion effectively connected between said anode and said cathode and a second inductance portion effectively connected between said cathode and said control grid, said first and second inductance portions including said intermediate connection point therebetween; and modulating condenser means having stationary plate means and mechanically vibratable element means in capacitive relation thereto, said vibratable element means being physically mechanically vibratable in response to mechanical input thereto, said modulating condenser means being effectively connected to said cathode and said anode of said electron oscillator tube and also being connected in parallel to and across said first inductance portion only as far as said intermediate connection point.

4. Electro-acoustic translating apparatus responsive to externally applied mechanical vibratory movement, as produced by vibratory elements of a musical instrument, said electro-acoustic translating apparatus being cooperable with power supply means, amplifying means and sound producing means for sound producing purposes, said electro-acoustic translating apparatus comprising: an electron oscillator tube including a cathode, anode, and control grid; a tuned parallel resonant circuit including inductance and capacitance connected in parallel with each other between opposite ends of said tuned parallel resonant circuit, and tuned parallel resonant circuit being operatively connected at one end thereof to said anode and at the other end thereof to said control grid, said inductance being operatively connected at an intermediate connection point near but spaced from the control grid end thereof to said cathode thus defining a first inductance portion effectively connected between said anode and said cathode and a second inductance portion effectively connected between said cathode and said control grid, said first and second inductance portions including said intermediate connection point therebetween; and modulating condenser means having stationary plate means and mechanically vibratable element means in capacitive relation thereto, said vibratable element means being physically mechanically vibratable in response to mechanical input thereto, said modulating condenser means being effectively connected to said cathode and said anode of said electron oscillator tube and also being connected in parallel to and across said first inductance portion only as far as said intermediate connection point.

5. Electro-acoustic translating apparatus responsive to externally applied mechanical vibratory movement, as produced by vibratory elements of a musical instrument, said electro-acoustic translating apparatus being cooperable with power supply means, amplifying means and sound producing means for sound producing purposes, said electro-acoustic translating apparatus comprising: an electron oscillator tube including a cathode, anode and control grid; an output audio detector means comprising a radio-frequency output filter circuit operatively connected to said anode; a tuned parallel resonant circuit including inductance and capacitance connected in parallel with each other between opposite ends of said tuned parallel resonant circuit, said tuned parallel resonant circuit being operatively connected at one end thereof to said anode and at the other end thereof to said control grid, said inductance being operatively connected at an intermediate connection point near but spaced from the control grid end thereof to said cathode thus defining a first inductance portion effectively connected between said anode and said cathode and a second inductance portion effectively connected between said cathode and said control grid, said first and second inductance portions including said intermediate connection point therebetween; and modulating condenser means having stationary plate means and mechanically vibratable element means in capacitive relation thereto, said vibratable element means being physically mechanically vibratable in response to mechanical input thereto, said modulating condenser means being effectively connected to said cathode and said anode of said electron oscillator tube and also being connected in parallel to and across said first inductance portion only as far as said intermediate connection point.

References Cited in the file of this patent

UNITED STATES PATENTS

| | | |
|---|---|---|
| 1,485,156 | Arnold | Feb. 26, 1924 |
| 2,273,975 | Miessner | Feb. 24, 1942 |
| 2,368,643 | Crosby | Feb. 6, 1945 |
| 2,535,341 | Zeckman | Dec. 26, 1950 |
| 2,551,807 | Merrill | May 8, 1951 |
| 2,656,755 | Miessner | Oct. 27, 1953 |

FOREIGN PATENTS

| | | |
|---|---|---|
| 258,643 | Great Britain | Sept. 22, 1926 |